United States Patent
Deak et al.

(10) Patent No.: US 9,797,721 B2
(45) Date of Patent: Oct. 24, 2017

(54) THREE-AXIS DIGITAL COMPASS

(71) Applicant: MultiDimension Technology Co., Ltd., Zhangjiagang (CN)

(72) Inventors: James Geza Deak, Zhangjiagang (CN); Zhimin Zhou, Zhangjiagang (CN); Dan Li, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 147 days.

(21) Appl. No.: 14/894,267

(22) PCT Filed: May 28, 2014

(86) PCT No.: PCT/CN2014/078685
§ 371 (c)(1),
(2) Date: Nov. 25, 2015

(87) PCT Pub. No.: WO2014/190909
PCT Pub. Date: Dec. 4, 2014

(65) Prior Publication Data
US 2016/0116283 A1    Apr. 28, 2016

(30) Foreign Application Priority Data

May 28, 2013 (CN) .......................... 2013 1 0202801

(51) Int. Cl.
*G01C 17/28* (2006.01)
*G01R 33/00* (2006.01)
*G01R 33/09* (2006.01)

(52) U.S. Cl.
CPC ......... *G01C 17/28* (2013.01); *G01R 33/0005* (2013.01); *G01R 33/0011* (2013.01); *G01R 33/09* (2013.01)

(58) Field of Classification Search
CPC .................................................... G01C 17/28
(Continued)

(56) References Cited

U.S. PATENT DOCUMENTS

| 6,556,007 B1* | 4/2003 | Itabashi | G01R 33/09 |
| | | | 324/252 |
| 7,112,957 B2* | 9/2006 | Bicking | G01D 5/145 |
| | | | 324/207.21 |

(Continued)

FOREIGN PATENT DOCUMENTS

| CN | 200958944 | 10/2007 |
| CN | 103116143 | 5/2013 |

(Continued)

OTHER PUBLICATIONS

"International Application No. PCT/CN2014/078685, International Search Report dated Sep. 16, 2014", (Sep. 16, 2014), 6 pgs.

*Primary Examiner* — G. Bradley Bennett
(74) *Attorney, Agent, or Firm* — Schwegman Lundberg & Woessner, P.A.

(57) ABSTRACT

A three-axis digital compass comprising two X-axis magnetic sensors, two Y-axis magnetic sensors, a flux concentrator, a signal sampling unit, a signal processing unit, and a signal output unit is disclosed. The X-axis and Y-axis magnetic sensors are arranged along a periphery of the flux concentrator. An external magnetic field is distorted when passing through the flux concentrator. An Z axis component of the external magnetic field is converted into X-axis or Y-axis magnetic field components when passing through the flux concentrator, and the so converted components of the external magnetic field act on the X-axis and Y-axis magnetic sensitive sensors. An output signal of the X-axis and Y-axis magnetic sensitive sensors is sent to the signal processing unit through the signal sampling unit, and it is used to calculate the three orthogonal components of the external magnetic field. These calculated external magnetic field components are output in a digital format through the signal output unit. The three-axis digital compass has a novel structure and an elegant computation algorithm. The (Continued)

design is compatible with AMR, GMR, TMR or other magnetoresistive sensor technology.

12 Claims, 5 Drawing Sheets

(58) Field of Classification Search
USPC .......................................................... 33/361
See application file for complete search history.

(56) References Cited

U.S. PATENT DOCUMENTS

| | | | | |
|---|---|---|---|---|
| 2002/0021124 | A1* | 2/2002 | Schott | G01D 5/145 324/207.2 |
| 2008/0052932 | A1* | 3/2008 | Xue | G01C 17/28 33/356 |
| 2010/0251557 | A1* | 10/2010 | Albo | F41G 3/02 33/318 |
| 2010/0307015 | A1* | 12/2010 | Mayor | G01C 17/38 33/303 |
| 2012/0206137 | A1 | 8/2012 | Cai et al. | |
| 2014/0054733 | A1* | 2/2014 | Deak | G01R 33/098 257/427 |
| 2014/0225605 | A1* | 8/2014 | Lei | G01R 33/093 324/252 |
| 2015/0128431 | A1* | 5/2015 | Kuo | G01R 33/0206 33/355 R |
| 2016/0223623 | A1* | 8/2016 | Deak | G01R 33/09 |
| 2016/0377428 | A1* | 12/2016 | Schubert | G01C 9/10 33/366.11 |

FOREIGN PATENT DOCUMENTS

| | | |
|---|---|---|
| CN | 103267520 | 8/2013 |
| CN | 203337153 | 12/2013 |
| WO | WO-2014/190909 | 12/2014 |

* cited by examiner

THREE-AXIS DIGITAL COMPASS

PRIORITY CLAIM TO RELATED APPLICATIONS

This application is a U.S. national stage application filed under 35 U.S.C. §371 from International Application Serial No. PCT/CN2014/078685, which was filed 28 May 2014, and published as WO2014/190909 on 4 Dec. 2014, and which claims priority to China Application No. 20130202801.1, filed 28 May 2013, which applications and publication are incorporated by reference as if reproduced herein and made a part hereof in their entirety, and the benefit of priority of each of which is claimed herein.

TECHNICAL FIELD

The present invention relates to magnetic sensor technology, particularly to three-axis digital compasses.

TECHNICAL BACKGROUND

In the field of consumer electronics, for example smart phones, tablet computers, and other portable electronic devices, there is a need to use three-axis compass combined with inertial measurement devices such as a three-axis gyroscopes, and three-axis accelerometers, in order to form a complete 9-axis inertial magnetic navigation unit. These three-axis compasses can simultaneously measure three magnetic field components at the same time, and they are composed of AMR, GMR, or TMR magnetoresistive sensors. These magnetoresistive sensors detect the magnetic field in the plane of the substrate, such that two magnetic field components, X, Y, can be detected by tow orthogonal magnetoresistive sensors on the same substrate, in order to realize a two-axis XY magnetic field sensor. However, for the Z-axis magnetic field component, one solution is to use a one-axis sensor installed on an orthogonal plane. This method has the following shortcomings:

1) An XY magnetic sensor with a Z-single axis magnetic sensor cannot be accomplished in a fully integrated manufacturing process, thereby adding complexity.

2) Relative to a fully integrated manufacturing process, the assembly of individual sensors into a three-axis compass is not very accurate, which impacts the accuracy of the resulting sensor.

3) Because the one-axis Z-axis magnetic sensor has a sensing axis perpendicular to the XY two-axis magnetic sensor, the size of the resulting three-axis magnetic field sensor is larger; this increases device size and increases complexity of the packaging process.

SUMMARY OF THE INVENTION

To solve the above problems, the present invention discloses a three-axis digital compass, the elements of the compass can be produced on a single chip, which utilizes a flux concentrator to distort the magnetic field, where the Z-axis magnetic field component perpendicular to the plane is transformed into in-plane XY components, which can be detected by the two X and Y magnetic sensors, and as a result the X and Y magnetic sensors can be used to simultaneously compute the X, Y, Z magnetic field components, and these X, Y, Z magnetic field components can then be separated out by an algorithm, which is then transformed into a digital signal. The present invention proposes a three-axis magnetic field sensor, comprising a flux concentrator, which distorts the external magnetic field such that the Z-axis component of the external magnetic field is turned into X-axis and Y-axis magnetic field components;

two X-axis magnetic sensors, where the X-axis magnetic sensors are respectively located near the edges of the flux concentrator on both sides along the X-axis direction, and each of the X-axis magnetic field sensors has a sensing direction parallel to the X axis;

two Y-axis magnetic sensors, where the Y-axis magnetic sensors are respectively located near the edges of the flux concentrator on both sides along the Y-axis direction, and each of the Y-axis magnetic field sensors has a sensing direction parallel to the Y axis;

a signal sampling unit, which is connected to the output terminal of each of the magnetic sensors, for use in sampling the output signals of the magnetic sensors;

a signal processing unit, which is connected to the output of the sampling unit, and the signal processing unit is used to calculate the corresponding X-axis, Y-axis, and Z-axis magnetic field components from the sampled signals;

a signal output unit, which sends out a digital signal representing the calculation performed by the signal processing unit.

Preferably, each of the X-axis magnetic sensors and the Y-axis magnetic sensors are deposited on the substrate surface and senses a magnetic field component parallel to the substrate surface.

Preferably, the X-axis magnetic sensors and the Y-axis magnetic sensors are composed of AMR, GMR, or TMR magnetic sensor elements.

Preferably, the X-axis magnetic sensors and the Y-axis magnetic sensors are spin-valves that have an X-axis magnetic sensing element with a pinned layer magnetization direction and a Y-axis magnetic sensing element with a pinned layer magnetization direction that are aligned in mutually orthogonal directions.

Preferably, the X-axis magnetic sensors and the Y-axis magnetic sensors each include at least a sensing element and a reference element, where the reference element is located under the flux concentrator, and the sensing elements are located along the edges of the flux concentrator.

Preferably, the X-axis component of the magnetic field correlates to the sum of the two output signals from the X-axis magnetic sensors, and the Y-axis component of the magnetic field correlates to the sum of the two output signals from the Y-axis magnetic sensors.

Preferably, the Z-axis component of the magnetic field correlates to the difference between the two output signals from the X-axis magnetic sensors, or it correlates to the difference between the two output signals from the Y-axis magnetic sensors, or it correlates to the difference between the sum of the X-axis magnetic sensor signal outputs added to the difference between the Y-axis magnetic sensor outputs.

Preferably, the flux concentrator is composed of a high permeability soft magnetic material NiFe, CoFeSiB, CoZrNb, CoFeB, FeSiB or FeSiBNbCu.

Preferably, the thickness of the flux concentrator is 1 to 20 um.

Preferably, the substrate contains CMOS, and the X-axis magnetic sensor and the Y-axis magnetic sensors are lithographically patterned on top of the substrate.

Further, the X-axis component of the magnetic field correlates to the sum of two output signals from the X-axis magnetic sensors, and the Y-axis component of the magnetic field correlates to the sum of two output signals from the Y-axis magnetic sensors, and the Z-axis component of the magnetic field correlates to the difference between the sum of the X-axis magnetic sensor signal outputs added to the difference between the Y-axis magnetic sensor outputs.

Further, the Z-axis component of the magnetic field correlates to the difference between the two output signals from the X-axis magnetic sensors, or it correlates to the difference between the two output signals from the Y-axis magnetic sensors, or it correlates to the difference between the sum of the X-axis magnetic sensor signal outputs added to the difference between the Y-axis magnetic sensor outputs.

The present invention has small size, a simple manufacturing process, easy packaging, novel structure, simple algorithm, and high measurement precision.

BRIEF DESCRIPTION OF THE DRAWINGS

In order to more clearly illustrate various implementations of the proposed technical solution, the following figures and text introduce simple examples in order to provide an introduction to the technical solution, obviously, the description below does not describe all possible cases, and the average person skilled in this technology, without any additional creativity, can using the appended drawings produce additional figures.

DESCRIPTION OF THE PREFERRED EMBODIMENTS

The figures below combined with preferred embodiment examples are used to describe the invention in detail.

First Embodiment

Figure 1:
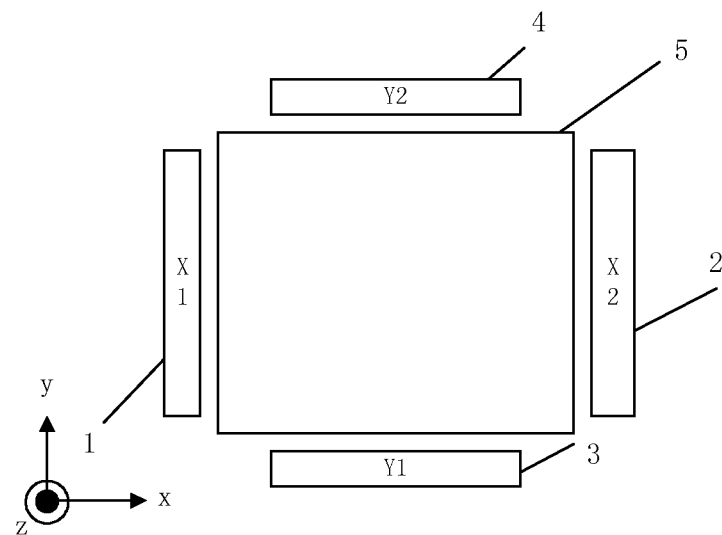
FIG. 1 is a top view of the three-axis compass of the present invention.

FIG. 1 shows a top-down view of the three-axis digital compass of the present invention. As can be seen from FIG. 1, the three-axis digital compass includes two X-axis magnetic sensors 1 and 2, two Y-axis magnetic sensors 3 and 4, and a flux concentrator 5. X-axis magnetic sensors 1 and 2 and Y-axis magnetic sensors 3 and 4 each include at least one sensing element and one reference element. They are deposited on the surface of the substrate, and arranged around the circumference of the flux concentrator 5, with the X-axis magnetic sensors 1 and 2 oppositely arranged, and the Y-axis magnetic sensors 3 and 4 oppositely arranged. The reference elements of the magnetic sensors are located under the flux concentrator 5, and the sensing elements are located around the edges of the flux concentrator 5. The X-axis magnetic sensors only detect the X-component of the magnetic field, and the Y-axis magnetic sensors only detect the Y-component of the magnetic field. The two X-axis magnetic sensors 1 and 2 and the two Y-axis magnetic sensors 3 and 4 can be AMR, GMR, or TMR type magnetoresistive sensors. They may be spin-valves, and the pinned layer magnetic moment direction of the X-axis magnetic sensors 1 and 2 are set orthogonally with respect to the pinned layer magnetization direction of Y-axis magnetic sensors 3 and 4. The flux concentrator 5 is composed of high permeability soft ferromagnetic material, preferably composed of an alloy such as NiFe, CoFeSiB, CoZrNb, CoFeB, FeSiB, or FeSiBNbCu. Preferably the flux concentrator 5 has a thickness of 1 to 20 um. The surface of the substrate is parallel to the XY plane, and the Z-axis is perpendicular to the substrate plane.

Second Embodiment

Figure 2:
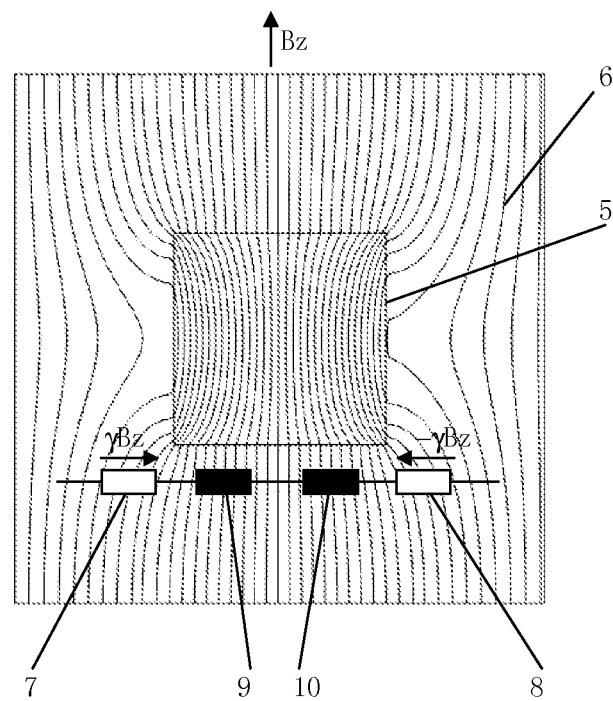
FIG. 2 is a diagram showing the distortion of a Z-axis magnetic field.

FIG. 2 shows the distribution of a Z-axis magnetic field component around flux concentrator 5. As can be seen from the distribution of the magnetic field lines 6, the Z-component of the magnetic field in the vicinity of the flux concentrator 5 are bent thereby generating a magnetic field component in the XY plane. The sensing elements 7 and 8 of the X-axis and Y-axis magnetic sensors arranged about the circumference of flux concentrator 5 can respectively measure the X-axis and Y-axis magnetic field components, producing output signals, while the reference elements 9 and 10 located under the flux concentrator 5 are not exposed to an X or Y magnetic field component, the field in their vicinity is nearly vertically oriented, so they do not produce and output a signal.

Third Embodiment

Figure 3:
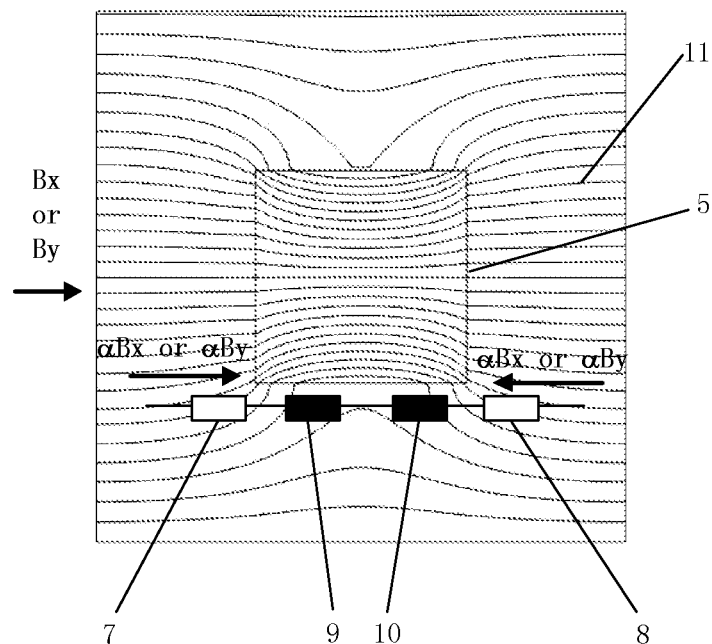
FIG. 3 is a diagram showing the distortion of an X-axis or a Y-axis magnetic field.

FIG. 3 shows a cross-sectional view in the X or Y plane, of the distribution of the magnetic field components around flux concentrator 5. From the magnetic field line distribution 11, it can be seen the X or Y plane magnetic field components in the vicinity of the flux concentrator 5 are bent, producing a Z-axis component, for reference elements 9 and 10 located under flux concentrator 5, the magnetic field is perpendicular near the interior region of the flux concentrator, producing almost entirely a Z-axis component, therefore a signal response is not produced. For sensing elements 7 and 8 located near the edges of flux concentrator 5, because there are X-axis and Y-axis magnetic field components present, an X-axis or a Y-axis oriented magnetic field will produce a response. The two X-axis magnetic field sensors will only produce a response to an X-axis magnetic field component, and they will not respond to a Y-axis magnetic field component. The two Y-axis magnetic field sensors will only produce a response to a Y-axis magnetic field component, and they will not respond to an X-axis magnetic field component.

Assuming that in the linear range, the sensor response has the following relationship with respect to an external magnetic field:

$$V_{ij} = S_{ij} B_{ij} + Vo_{ij}$$

Where i=1 or 2, and j=x or y. $S_{ij}$ represents the magnetic sensor sensitivity, and it has the following range of values:

$S_{ij}$: $0<S_{ij}<100$ mV/V/G;

$B_{ij}$ represents the magnetic field at the location of each sensor location.

The external magnetic field along the X-axis, the Y-axis, and the Z-axis has three components $B_x$, $B_y$, and $B_z$ which become distorted after passing through the flux concentrator. At X1, X2, Y1, and Y2 magnetic sensors positions 1-4, the magnetic fields $B_{1x}$, $B_{2x}$, $B_{1y}$, and $B_{2y}$ may be expressed:

$B_{1x} = \alpha B_x + \gamma B_z$ $B_{2x} = \alpha B_x - \gamma B_z$ $B_{1y} = \alpha B_y + \gamma B_z$ $B_{2y} = \alpha B_y - \gamma B_z$ The sensor's output voltage is related to a linear combination of magnetic field component $B_x$, $B_y$, and $B_z$:

$V_{1x} = S_{1x}(\alpha B_x + \gamma B_z) + Vo_{1x}$ $V_{2x} = S_{2x}(\alpha B_x - \gamma B_z) + Vo_{2x}$ $V_{1y} = S_{1y}(\alpha B_y + \gamma B_z) + Vo_{1y}$ $V_{2y} = S_{2y}(\alpha B_y - \gamma B_z) + Vo_{2y}$ Wherein, $\alpha$ and $\gamma$ are the magnetic field gain coefficients of the flux concentrator 5 for the external magnetic field, and they are a function of its length (L), width (W), and thickness (t).

$\alpha = \alpha(L, W, t)$ $\gamma = \gamma(L, W, t)$

Where, $\alpha$: $0<|\alpha|<100$ $\gamma$: $0<|\gamma|<100$

In order to solve these Linear equations for the sensor output, we can take the four output voltage signals $V_{1x}$, $V_{2x}$, $V_{1y}$, $V_{2y}$, and solve them for a unique set of magnetic field values $B_x$, $B_y$, $B_z$:

$$B_x = \frac{(V_{1x} + V_{2x}) - (Vo_{1x} + Vo_{2x})}{\alpha(S_{1x} + S_{2x})}$$

$$B_y = \frac{(V_{1y} + V_{2y}) - (Vo_{1y} + Vo_{2y})}{\alpha(S_{1y} + S_{2y})}$$

$$B_z = \frac{(V_{2x} - V_{1x}) + (V_{2y} - V_{1y}) + (Vo_{1x} - Vo_{2x}) + (Vo_{1y} - Vo_{2y})}{\gamma(S_{1x} + S_{2x} + S_{1y} + S_{2y})}$$

For simplicity, calibration constants can be defined:

$V_{0x} = Vo_{1x} + Vo_{2x}$ $S_x = \alpha(S_{1x} + S_{2x})$ where $B_{ox} = V_{ox}/S_x$ $V_{0y} = Vo_{1y} + Vo_{2y}$ $S_y = \alpha(S_{1y} + S_{2y})$ where $B_{oy} = V_{oy}/S_y$ $V_{0z} = (Vo_{2x} - Vo_{1x}) + (Vo_{2y} - Vo_{1y})$ $S_z = \gamma(S_{1x} + S_{2x} + S_{1y} + S_{2y})$ where $B_{oz} = V_{oz}/S_z$ Thus, by solving the following three simple equations, using 3 sensitivity and 3 offset calibration coefficients, you can obtain the three magnetic field components $B_x$, $B_y$, and $B_z$. Therefore the calibration of this three-axis compass is the same complexity as the prior art designs.

$$B_x = \frac{(V_{1x} + V_{2x}) - V_{ox}}{S_x} \text{ or } B_x = \frac{(V_{1x} + V_{2x})}{S_x} - B_{ox}$$

$$B_y = \frac{(V_{1y} + V_{2y}) - V_{oy}}{S_y} \text{ or } B_y = \frac{(V_{1y} + V_{2y})}{S_y} - B_{oy}$$

$$B_z = \frac{(V_{2x} - V_{1x}) + (V_{2y} - V_{1y}) - V_{oz}}{S_z} \text{ or }$$

$$B_z = \frac{(V_{2x} - V_{1x}) + (V_{2y} - V_{1y})}{S_z} - B_{oz}$$

Fourth Embodiment

Figure 4:
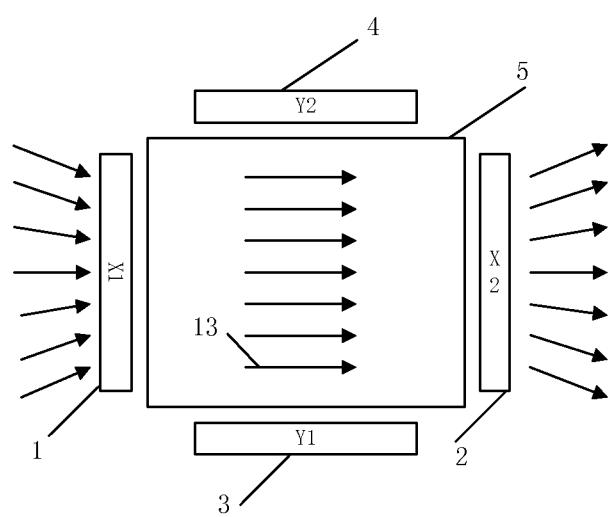
FIG. 4 is a diagram illustrating the measuring principle of the three-axis digital compass with magnetic field applied along the X-axis.
Figure 5:
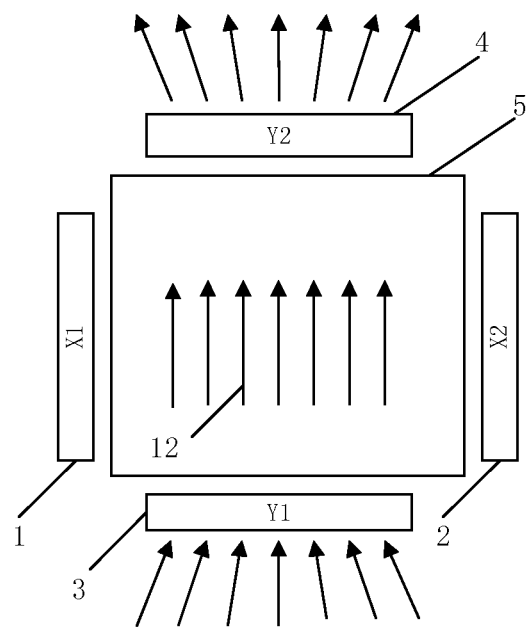
FIG. 5 is a diagram illustrating the measuring principle of the three-axis digital compass with magnetic field applied along the Y-axis.
Figure 6:
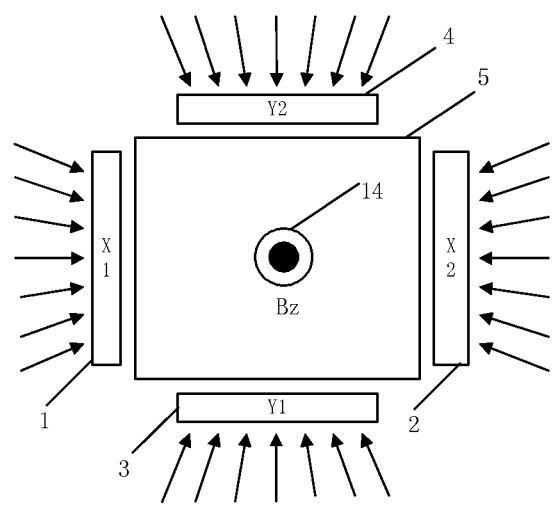
FIG. 6 is a diagram illustrating the measuring principle of the three-axis digital compass with magnetic field applied along the Z-axis.

FIGS. 4, 5, and 6 respectively show the magnetic field distributions for external magnetic fields applied in the X, Y, Z directions. For only the X-axis magnetic field component 13, By=0, Bz=0, the output of the X is axis and the Y-axis magnetic sensors are respectively:

$V_{1x} = S_{1x}(\alpha B_x) + Vo_{1x}$ $V_{2x} = S_{2x}(\alpha B_x) + Vo_{2x}$ $V_{1y} = Vo_{1y}$ $V_{2y} = Vo_{2y}$ From the above four equations, it can be seen that $V_{1x}$, $V_{2x}$ are related to the external magnetic field, and $V_{1y}$, $V_{2y}$ are unrelated to the external magnetic field, and $$B_x = \frac{(V_{1x} + V_{2x})}{S_x} - B_{ox}$$

FIG. 5 shows the $B_y$ magnetic field component 12, when $B_x=0$, $B_z=0$. Then the X-axis and Y-axis magnetic sensor outputs are:

$V_{1x} = Vo_{1x}$ $V_{2x} = Vo_{2x}$ $V_{1y} = S_{1y}(\alpha B_y) + Vo_{1y}$ $V_{2y} = S_{2y}(\alpha B_y) + Vo_{2y}$ From the above four equations, it can be seen that $V_{1x}$, $V_{2x}$ have no dependence on the external magnetic field, and $V_{1y}$, $V_{2y}$ depend on the external magnetic field, such that $$B_y = \frac{(V_{1y} + V_{2y})}{S_y} - B_{oy}$$

FIG. 6 shows magnetic field component $B_z$ 14, in the case where $B_x=0$, $B_y=0$, the X-axis and Y-axis magnetic sensor outputs are respectively:

$$V_{1x}=S_{1x}(\gamma B_z)+V_{o1x}$$

$$V_{2x}=S_{2x}(-\gamma B_z)+V_{o2x}$$

$$V_{1y}=S_{1y}(\gamma B_z)+V_{o1y}$$

$$V_{2y}=S_{2y}(-\gamma B_z)+V_{o2y}$$

From this it can be seen $V_{1x}$, $V_{2x}$, $V_{1y}$, and $V_{2y}$ are related to the external magnetic field, and $$B_z = \frac{(V_{2x} - V_{1x}) + (V_{2y} - V_{1y})}{S_z} - B_{oz}$$

Fifth Embodiment

Figure 7:
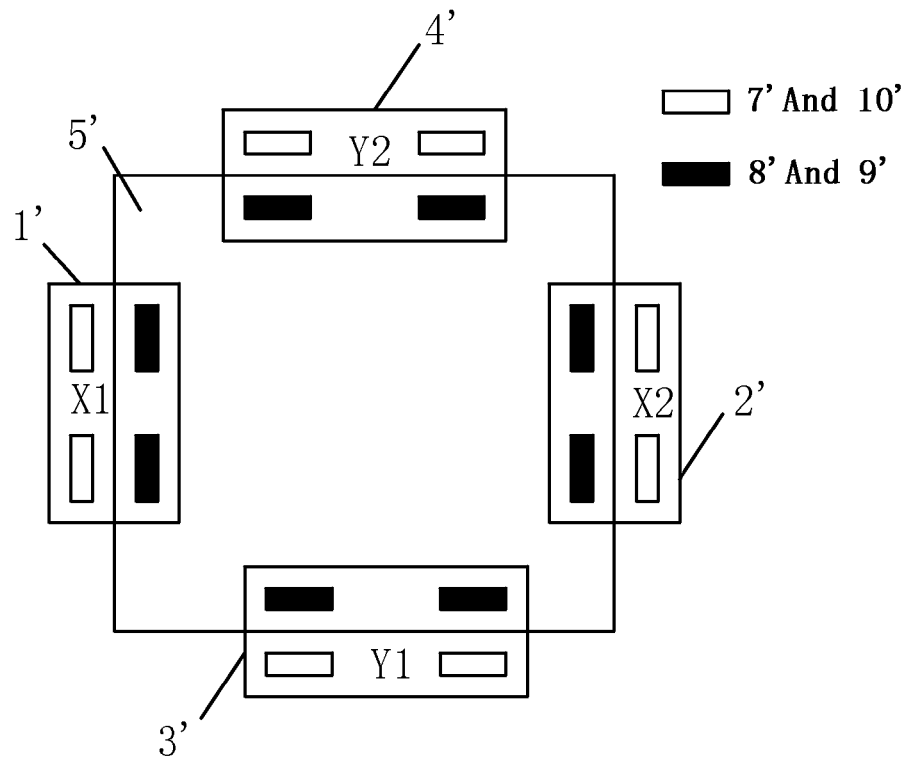
FIG. 7 shows an illustration of a block diagram of a specific embodiment of the present invention.
Figure 8:
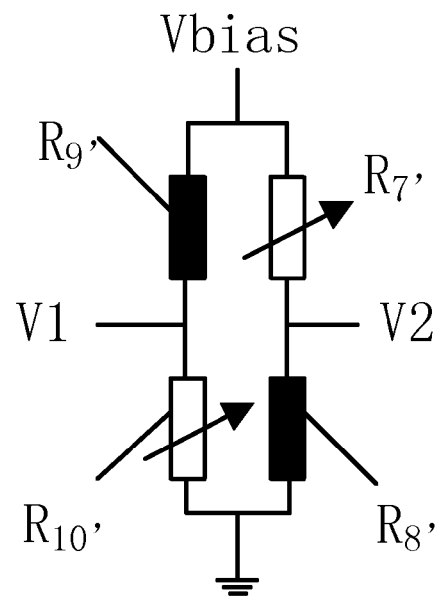
FIG. 8 shows a schematic diagram of the circuit for the X-axis and Y-axis referenced bridge magnetic sensors.

FIG. 7 shows another implementation example of a specific embodiment of the three-axis digital compass invention. In the figure the X-axis magnetic sensors (1', 2') and Y-axis magnetic sensors (3', 4') sense XY magnetic field components in the plane parallel to the surface of the substrate, the figure shows the plane parallel to the XY plane. The magnetic sensors may be AMR, GMR, or TMR sensors. Each magnetic sensor includes two reference elements 8' and 9', which are located directly below the flux concentrator 5, as well as two sensing elements 7' and 10', which are arranged around the outer periphery of flux concentrator 5. The reference elements 8' and 9' are not exposed to XY magnetic field components, so there is no response to the external magnetic field, thus through the two X and Y axis magnetic sensors 7' and 10' the magnetic field sensor signal output is produced. Reference elements 8' and 9' may also be used as sensing elements in place of sensing elements 7' and 10' around the outer edge of flux concentrator 5'. Reference elements 8', 9' and sensing elements 7', 10' are connected as a full bridge as shown in FIG. 8. In this figure, each of the elements has its pinned layer magnetization set in the same direction, such that the full bridge circuit produces the following output voltage $$V = V_1 - V_2 = \frac{R_{10'}}{R_{9'} + R_{10'}}V_{Bias} - \frac{R_{8'}}{R_{8'} + R_{7'}}V_{Bias}$$

Sixth Embodiment

Figure 9:
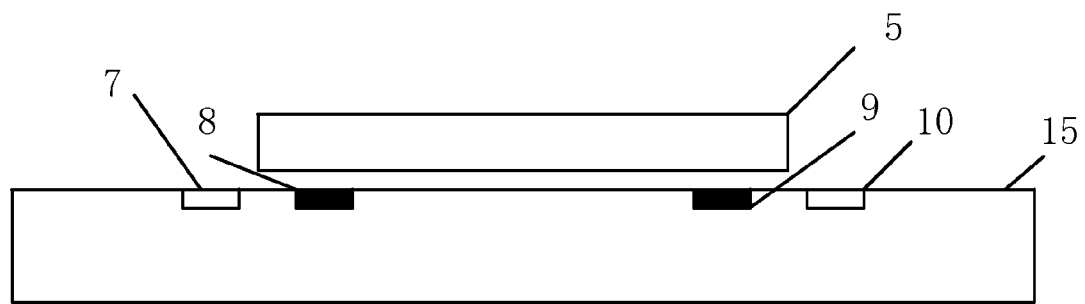
FIG. 9 shows a cross-sectional view of a three-axis digital compass of the present invention.

FIG. 9 is a schematic diagram showing the structure of the three-axis digital compass, the X, Y axis magnetic sensors sense elements 7 and 8 are located around the outer periphery of flux concentrator 5, reference elements 9 and 10 are located below the edge of flux concentrator 5, reference elements 9, 10 and sense elements 7, 8 are lithographically patterned on the surface of CMOS substrate 15.

Figure 10:
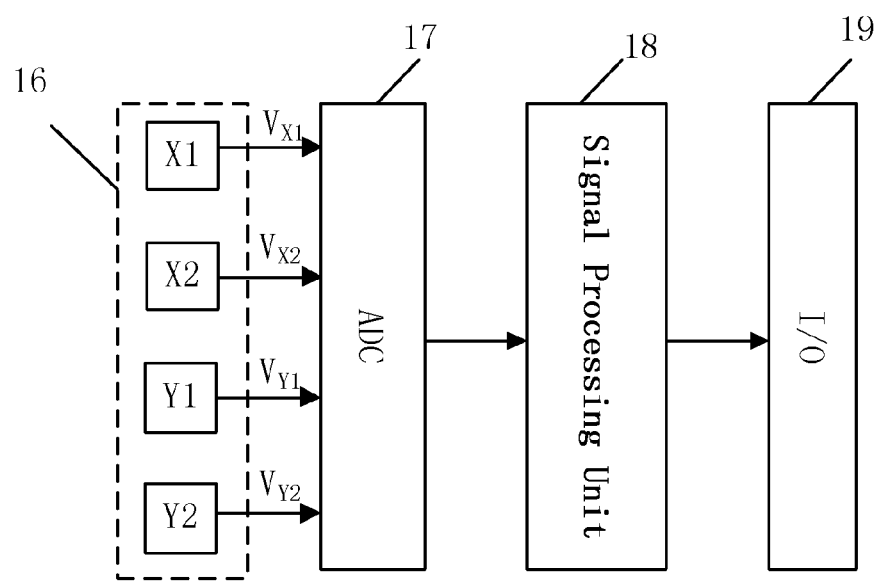
FIG. 10 shows a schematic diagram of the signal processing system used for the three-axis digital compass of the present invention.

FIG. 10 shows a diagram of the three-axis digital compass's signal processing circuit. X1, X2, Y1, and Y2 axial magnetic field sensors output ends are electrically connected with the inputs of the signal sampling unit ADC 17, the output signals $V_{1x}$, $V_{2x}$, $V_{1y}$, and $V_{2y}$ are passed to the signal sampling unit ADC 17 and converted into a digital signal, ADC signal sampling unit's 17 digitally converted signal is sent to the signal processing unit 18 through its electrically connected output, the signal processing unit 18 then performs addition and subtraction operations on the $V_{1x}$, $V_{2x}$, $V_{1y}$, and $V_{2y}$ as follows:

$$V_{1x}=S_{1x}(\alpha B_x+\gamma B_z)+V_{o1x}$$

$$V_{2x}=S_{2x}(\alpha B_x-\gamma B_z)+V_{o2x}$$

$$V_{1y}=S_{1y}(\alpha B_y+\gamma B_z)+V_{o1y}$$

$$V_{2y}=S_{2y}(\alpha B_y-\gamma B_z)+V_{o2y}$$

Wherein, $\alpha$ and $\gamma$ are the magnetic field gain coefficients of the flux concentrator 5 for the external magnetic field, and they are a function of its length (L), width (W), and thickness (t).

$$\alpha=\alpha(L,W,t)$$

$$\gamma=\gamma(L,W,t)$$

Then by using the following equations the voltage signals can be converted into the three magnetic field components:

$$B_x = \frac{(V_{1x} + V_{2x}) - V_{ox}}{S_x} \text{ or } B_x = \frac{(V_{1x} + V_{2x})}{S_x} - B_{ox}$$

$$B_y = \frac{(V_{1y} + V_{2y}) - V_{oy}}{S_y} \text{ or } B_y = \frac{(V_{1y} + V_{2y})}{S_y} - B_{oy}$$

$$B_z = \frac{(V_{2x} - V_{1x}) + (V_{2y} - V_{1y}) - V_{oz}}{S_z} \text{ or }$$

$$B_z = \frac{(V_{2x} - V_{1x}) + (V_{2y} - V_{1y})}{S_z} - B_{oz}$$

The result of the three dimensional magnetic field calculations is transferred to the signal output unit 19, enabling the three-axis digital compass to output the components of the external magnetic field measurement.

The Z-axis component of the magnetic field correlates to the difference between the two output signals from the X-axis magnetic sensors, or it correlates to the difference between the two output signals from the Y-axis magnetic sensors, or it correlates to the difference between the sum of the X-axis magnetic sensor signal outputs added to the difference between the Y-axis magnetic sensor outputs. In this embodiment of the present invention, the other methods can ultimately be described in a corresponding manner, but the first two methods have no substantial difference, and people skilled in the art can after seeing these implementations immediately and without the slightest doubt, conclude this from the first two methods, therefore the above detailed description of the methods will not be repeated.

The foregoing presents preferred embodiments of the present invention, but it does not limit the invention. For technical personnel skilled in the art, the present invention can be made to have various modifications and changes. Any changes, equivalent replacements, or improvements, within spirit and principles of the present invention, should be included within the scope of the present invention.

The invention claimed is:

1. A three-axis digital compass, comprising:
   a flux concentrator, which distorts the external magnetic field such that the Z-axis component of the external magnetic field is turned into X-axis and Y-axis magnetic field components;
   two X-axis magnetic sensors, where the X-axis magnetic sensors are respectively located near the edges of the flux concentrator on both sides along the X-axis direction, and each of the X-axis magnetic field sensors has a sensing direction parallel to the X axis;
   two Y-axis magnetic sensors, where the Y-axis magnetic sensors are respectively located near the edges of the flux concentrator on both sides along the Y-axis direction, and each of the Y-axis magnetic field sensors has a sensing direction parallel to the Y axis;
   a signal sampling unit, which is connected to the output terminal of each of the magnetic sensors, for use in sampling the output signals of the magnetic sensors;
   a signal processing unit, which is connected to the output of the sampling unit, and the signal processing unit is used to calculate the corresponding X-axis, Y-axis, and Z-axis magnetic field components from the sampled signals; and
   a signal output unit, which sends out a digital signal representing the calculation performed by the signal processing unit.

2. The three-axis digital compass of claim 1, wherein each of the X-axis magnetic sensors and the Y-axis magnetic sensors are deposited on the substrate surface and senses a magnetic field component parallel to the substrate surface.

3. The three-axis digital compass of claim 1, wherein the X-axis magnetic sensors and the Y-axis magnetic sensors are composed of AMR, GMR, or TMR magnetic sensor elements.

4. The three-axis digital compass of claim 1, wherein the X-axis magnetic sensors and the Y-axis magnetic sensors are spin-valves that have an X-axis magnetic sensing element with a pinned layer magnetization direction and a Y-axis magnetic sensing element with a pinned layer magnetization direction that are aligned in mutually orthogonal directions.

5. The three-axis digital compass of claim 1, wherein the X-axis magnetic sensors and the Y-axis magnetic sensors each include at least a sensing element and a reference element, where the reference element is located under the flux concentrator, and the sensing elements are located along the edges of the flux concentrator.

6. The three-axis digital compass of claim 1, wherein the X-axis component of the magnetic field correlates to the sum of the two output signals from the X-axis magnetic sensors, and the Y-axis component of the magnetic field correlates to the sum of the two output signals from the Y-axis magnetic sensors.

7. The three-axis digital compass of claim 1, wherein the Z-axis component of the magnetic field correlates to the difference between the two output signals from the X-axis magnetic sensors, or it correlates to the difference between the two output signals from the Y-axis magnetic sensors, or it correlates to the difference between the sum of the X-axis magnetic sensor signal outputs added to the difference between the Y-axis magnetic sensor outputs.

8. The three-axis digital compass of claim 1, wherein the flux concentrator is composed of a high permeability soft magnetic material NiFe, CoFeSiB, CoZrNb, CoFeB, FeSiB or FeSiBNbCu.

9. The three-axis digital compass of claim 1, wherein the thickness of the flux concentrator is 1 to 20 mm.

10. The three-axis digital compass of claim 1, wherein the substrate contains CMOS, and the X-axis magnetic sensor and the Y-axis magnetic sensors are lithographically patterned on top of the substrate.

11. The three-axis digital compass of claim 10, wherein the X-axis component of the magnetic field correlates to the sum of two output signals from the X-axis magnetic sensors, and the Y-axis component of the magnetic field correlates to the sum of two output signals from the Y-axis magnetic sensors.

12. The three-axis digital compass of claim 10, wherein the Z-axis component of the magnetic field correlates to the difference between the two output signals from the X-axis magnetic sensors, or it correlates to the difference between the two output signals from the Y-axis magnetic sensors, or it correlates to the difference between the sum of the X-axis magnetic sensor signal outputs added to the difference between the Y-axis magnetic sensor outputs.

* * * * *